(12) United States Patent
Ueno et al.

(10) Patent No.: US 9,136,367 B2
(45) Date of Patent: Sep. 15, 2015

(54) SEMICONDUCTOR DEVICE

(71) Applicant: TOYODA GOSEI CO., LTD., Kiyosu-shi, Aichi-ken (JP)

(72) Inventors: Yukihisa Ueno, Kiyosu (JP); Toru Oka, Kiyosu (JP); Kazuya Hasegawa, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 14/323,159

(22) Filed: Jul. 3, 2014

(65) Prior Publication Data

US 2015/0021618 A1    Jan. 22, 2015

(30) Foreign Application Priority Data

Jul. 17, 2013    (JP) .................................. 2013-148170

(51) Int. Cl.
*H01L 27/04* (2006.01)
*H01L 29/78* (2006.01)
*H01L 21/28* (2006.01)
*H01L 29/20* (2006.01)
*H01L 29/06* (2006.01)
*H01L 29/66* (2006.01)
*H01L 23/31* (2006.01)

(52) U.S. Cl.
CPC ............ *H01L 29/78* (2013.01); *H01L 23/3178* (2013.01); *H01L 23/3192* (2013.01); *H01L 29/0692* (2013.01); *H01L 29/2003* (2013.01); *H01L 29/66143* (2013.01)

(58) Field of Classification Search
CPC .............. H01L 23/3171; H01L 29/475; H01L 29/2003; H01L 29/0692; H01L 29/66143; H01L 23/3192; H01L 23/3178; H01L 29/78

USPC ..................... 257/76, 77, 192, 194, 411, 471, 257/E29.089, E29.246, E29.255, E21.403; 438/172, 570, 576, 589
See application file for complete search history.

(56) References Cited

U.S. PATENT DOCUMENTS

| | | | |
|---|---|---|---|
| 2007/0164322 A1* | 7/2007 | Smith et al. | 257/256 |
| 2007/0241419 A1* | 10/2007 | Green et al. | 257/499 |
| 2009/0321854 A1* | 12/2009 | Ohta et al. | 257/411 |
| 2010/0159656 A1 | 6/2010 | Nakata et al. | |
| 2010/0327318 A1* | 12/2010 | Okamoto et al. | 257/192 |
| 2011/0057232 A1* | 3/2011 | Sheppard et al. | 257/194 |

FOREIGN PATENT DOCUMENTS

| | | |
|---|---|---|
| JP | 2008-198787 A | 8/2008 |
| JP | 2010-166040 A | 7/2010 |
| JP | 2011-77123 A | 4/2011 |

* cited by examiner

*Primary Examiner* — Dao H Nguyen
(74) *Attorney, Agent, or Firm* — Posz Law Group, PLC

(57) ABSTRACT

A semiconductor device includes: a p-type semiconductor layer mainly made of GaN; an n-type semiconductor layer mainly made of GaN and joined with the p-type semiconductor layer; a protective film arranged to coat the p-type semiconductor layer and the n-type semiconductor layer; a gate insulating film arranged to coat the p-type semiconductor layer and the n-type semiconductor layer; and a gate electrode joined with the gate insulating film. The protective film includes: a first layer made of $Al_2O_3$ and arranged adjacent to the p-type semiconductor layer and the n-type semiconductor layer to coat an edge of a p-n junction surface; a second layer made of an electrical insulation material different from $Al_2O_3$ and formed on the first layer; and an opening structure formed to pass through the first layer and the second layer. The gate insulating film is placed inside of the opening structure.

7 Claims, 6 Drawing Sheets

SEMICONDUCTOR DEVICE

CROSS-REFERENCE TO RELATED APPLICATION

The present application claims priority from Japanese patent application JP2013-148170 filed on Jul. 17, 2013, the entirety of disclosures of which is hereby incorporated by reference into this application.

BACKGROUND

1. Technical Field

The present invention relates to a semiconductor device.

2. Related Art

GaN-based semiconductor devices having one or more semiconductor layers mainly made of gallium nitride (GaN) have been known as one type of semiconductor devices (semiconductor elements). Some of the GaN-based semiconductor devices may serve as a MOSFET (Metal-Oxide Semiconductor Field-Effect Transistor). In order to reduce the leak current on the interface of the semiconductor layer, relieve the potential crowding on the semiconductor layer and protect a junction surface between two semiconductor layers, a protective film is formed to coat the semiconductor layer in the GaN-based semiconductor device. The protective film is made of an electrical insulation material. In terms of reducing the potential damage of the semiconductor layer, wet etching is more preferable than dry etching for the etching process of the protective film.

JP 2008-198787A describes a protective film made of one type of electrical insulation material selected out of, for example, silicon dioxide ($SiO_2$) and aluminum oxide ($Al_2O_3$). JP 2011-77123A describes separately forming two layers of a protective film made of silicon nitride (SiN), in order to form an opening structure below the working limit by photolithography. JP 2010-166040A describes forming a protective film made of, for example, silicon dioxide ($SiO_2$) or silicon oxynitride (SiON) on a gate insulating film made of aluminum oxide ($Al_2O_3$), in order to suppress erosion of the gate insulating film during manufacture.

SUMMARY

According to an experiment performed by the inventors of the present invention, in terms of reducing the leak current, $Al_2O_3$ is effectively used as the electrical insulation material of the protective film in the GaN-based semiconductor device. Increasing the thickness of the protective film made of $Al_2O_3$ to ensure the sufficient dielectric breakdown strength, however, causes a problem of etching failure (peel-off or drop-off of a resist mask) during processing by wet etching.

In the GaN-based semiconductor device, there is accordingly a need for providing the technique that achieves both improvement of the electrical properties and improvement of the workability of the protective film. With regard to the semiconductor device, there are also other needs of cost reduction, miniaturization, easy manufacturing, resource saving, improved usability and improved durability.

In order to solve at least part of the problems described above, the invention may be implemented by the following aspects.

(1) According to one aspect of the invention, there is provided a semiconductor device. The semiconductor device comprises: a p-type semiconductor layer mainly made of gallium nitride (GaN); an n-type semiconductor layer mainly made of gallium nitride (GaN) and joined with the p-type semiconductor layer; a protective film provided to have electrical insulation property, arranged to coat the p-type semiconductor layer and the n-type semiconductor layer and configured to have: a first layer made of aluminum oxide ($Al_2O_3$) and arranged adjacent to the p-type semiconductor layer and the n-type semiconductor layer to coat an edge of a p-n junction surface where the p-type semiconductor layer is joined with the n-type semiconductor layer; a second layer made of an electrical insulation material different from aluminum oxide ($Al_2O_3$) and formed on the first layer; and an opening structure formed to pass through the first layer and the second layer; a gate insulating film provided to have electrical insulation property and placed inside of the opening structure of the protective film to coat the p-type semiconductor layer and the n-type semiconductor layer; and a gate electrode joined with the gate insulating film. According to this aspect, the first layer serves to reduce the leak current on the respective interfaces of the semiconductor layers, whereas the second layer serves to reinforce the dielectric breakdown strength and thereby reduce the thickness required for the first layer. This accordingly achieves both improvement of the electrical properties and improvement of the workability of the protective film.

(2) According to one embodiment of the semiconductor device described above, the electrical insulation material of the second layer may be at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON). According to this embodiment, application of silicon dioxide ($SiO_2$) for the electrical insulation material effectively improves the dielectric breakdown strength of the protective film. Application of at least one of silicon dioxide ($SiO_2$), silicon nitride (SiN) and silicon oxynitride (SiON) for the electrical insulation material allows for selection between wet etching and dry etching as the technique of etching the second layer and thereby enhances the flexibility of the processing technique of the protective film. Selection of dry etching further improves the workability of the protective film. Application of at least one of hafnium oxide ($HfO_2$), aluminum nitride (AlN), zirconium oxide ($ZrO_2$) and zirconium oxynitride (ZrON) for the electrical insulation material effectively improves the function of the protective film that relieves the potential crowding.

(3) According to another embodiment of the semiconductor device described above, the first layer may have a thickness equal to or less than 500 nm. This embodiment effectively suppresses etching failure of the first layer by wet etching.

(4) According to another embodiment of the semiconductor device described above, a total thickness of the protective film including the first layer and the second layer may be equal to or greater than 400 nm. This embodiment ensures the sufficient electrical properties of the protective film.

(5) According to another embodiment of the semiconductor device described above, a surface of the first layer that defines part of the opening structure may be sloped outward from the opening structure from a semiconductor layer side to a second layer side. In this embodiment including the first layer having this sloped surface, the opening structure is formed by removing part of the first layer from the semiconductor layer by wet etching. This suppresses the potential damage of the semiconductor layer, compared with the structure of removing part of the first layer by dry etching.

According to another aspect of the invention, there is provided a manufacturing method of a semiconductor device. The manufacturing method comprises: forming a p-type semiconductor layer mainly made of gallium nitride (GaN);

forming an n-type semiconductor layer mainly made of gallium nitride (GaN) to be joined with the p-type semiconductor layer; forming a protective film configured to have electrical insulation property and coat the p-type semiconductor layer and the n-type semiconductor layer, wherein the forming the protective film comprises: forming a first layer made of aluminum oxide ($Al_2O_3$) on surfaces of the p-type semiconductor layer and the n-type semiconductor layer which include an edge of a p-n junction surface where the p-type semiconductor layer is joined with the n-type semiconductor layer; forming a second layer made of an electrical insulation material different from aluminum oxide ($Al_2O_3$) on the first layer; and forming an opening structure to pass through the first layer and the second layer; forming a gate insulating film configured to have electrical insulation property and coat the p-type semiconductor layer and the n-type semiconductor layer to be located inside of the opening structure of the protective film; and forming a gate electrode to be joined with the gate insulating film. This aspect achieves both improvement of the electrical properties and improvement of the workability of the protective film.

The invention may be implemented by any of various aspects other than the semiconductor device and the manufacturing method thereof: for example, an electrical apparatus including the semiconductor device described above and a manufacturing apparatus for manufacturing the semiconductor device described above.

According to any of the aspects of the invention described above, the first layer serves to reduce the leak current on the interface of each semiconductor layer, whereas the second layer serves to reinforce the dielectric breakdown strength and thereby reduce the film thickness required for the first layer. This accordingly achieves both improvement of the electrical properties and improvement of the workability of the protective film.

BRIEF DESCRIPTION OF DRAWINGS

The invention will be described with reference to the accompanying drawings in which.

DESCRIPTION OF EMBODIMENTS

A. First Embodiment

A-1. Configuration of Semiconductor Device

Figure 1:
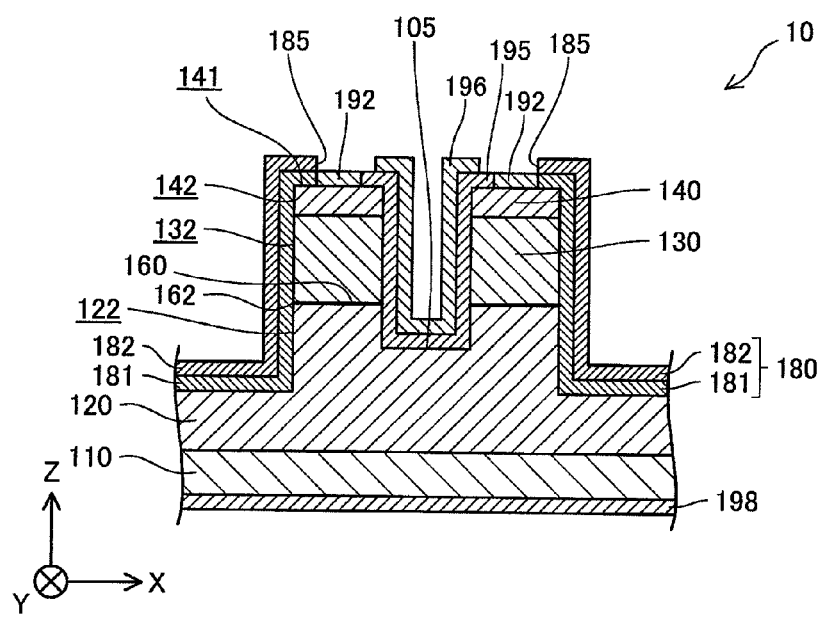
FIG. 1 is a cross sectional view schematically illustrating the configuration of a semiconductor device according to a first embodiment.

FIG. 1 is a cross sectional view schematically illustrating the configuration of a semiconductor device 10 according to a first embodiment. X, Y and Z axes orthogonal to one another are shown in FIG. 1.

Among the XYZ axes shown in FIG. 1, the X axis is an axis from the left side of the sheet surface to the right side of the sheet surface; +X-axis direction represents a direction toward the right side of the sheet surface; and −X-axis direction represents a direction toward the left side of the sheet surface. Among the XYZ axes shown in FIG. 1, the Y axis is an axis from the front side of the sheet surface to the back side of the sheet surface; +Y axis direction represents a direction toward the back side of the sheet surface; and −Y-axis direction represents a direction toward the front side of the sheet surface. Among the XYZ axes shown in FIG. 1, the Z axis is an axis from the bottom of the sheet surface to the top of the sheet surface; +Z-axis direction represents a direction toward the top of the sheet surface; and −Z-axis direction represents a direction toward the bottom of the sheet surface.

The semiconductor device 10 is a GaN-based semiconductor device formed using gallium nitride (GaN). According to this embodiment, the semiconductor device 10 is a vertical MOSFET. The semiconductor device 10 includes a substrate 110, a semiconductor layer 120, a semiconductor layer 130, a semiconductor layer 140, a protective film 180, source electrodes 192, a gate insulating film 195, a gate electrode 196, and a drain electrode 198. A trench 105 is formed in the semiconductor device 10 as a groove recessed from the semiconductor layer 140 through the semiconductor layer 130 to the semiconductor layer 120.

The substrate 110 of the semiconductor device 10 is a semiconductor layer formed in a plate-like shape extended along the X axis and the Y axis. According to this embodiment, the substrate 110 is an n-type semiconductor layer which is mainly made of gallium nitride (GaN) and contains silicon (Si) as the donor.

The semiconductor layer 120 of the semiconductor device 10 is an n-type semiconductor layer formed in a plate-like shape extended along the X axis and the Y axis. According to this embodiment, the semiconductor layer 120 is mainly made of gallium nitride (GaN) and contains silicon (Si) as the donor. The semiconductor layer 120 is formed on the +Z-axis direction side of the substrate 110. The semiconductor layer 120 has an interface 122 extended along the Y axis and the Z axis.

The semiconductor layer 130 of the semiconductor device 10 is a p-type semiconductor layer extended along the X axis and the Y axis and parted by the trench 105. According to this embodiment, the semiconductor layer 130 is mainly made of gallium nitride (GaN) and contains magnesium (Mg) as the acceptor. The semiconductor layer 130 is formed on the +Z-axis direction side of the semiconductor layer 120. The semiconductor layer 130 has an interface 132 extended along the Y axis and the Z axis.

The semiconductor layer 140 of the semiconductor device 10 is an n-type semiconductor layer extended along the X axis and the Y axis and parted by the trench 105. According to this embodiment, the semiconductor layer 140 is mainly made of gallium nitride (GaN) and contains silicon (Si) as the donor. The carrier concentration of the semiconductor layer 140 is higher than the respective carrier concentrations of the substrate 110 and the semiconductor layer 120. The semiconductor layer 140 has an interface 141 extended along the X axis and the Y axis and arranged to face the +Z-axis direction and an interface 142 extended along the Y axis and the Z axis.

A p-n junction surface 160 is formed between the semiconductor layer 120 and the semiconductor layer 130. The p-n junction surface 160 is an interface where the semiconductor layer 120 is joined with the semiconductor layer 130. An edge 162 of the p-n junction surface 160 forms a boundary between the interface 122 of the semiconductor layer 120 and the interface 132 of the semiconductor layer 130.

The protective film 180 of the semiconductor device 10 has electrical insulation properties and is arranged to coat the respective interfaces of the semiconductor layer 120, the semiconductor layer 130 and the semiconductor layer 140. According to this embodiment, the protective film 180 covers the range from an interface on the +Z-axis direction side of the semiconductor layer 120 through the interface 122 of the semiconductor layer 120, the edge 162 of the p-n junction surface 160, the interface 132 of the semiconductor layer 130 and the interface 142 of the semiconductor layer 140 to the interface 141 of the semiconductor layer 140.

According to this embodiment, the breakdown voltage required for the semiconductor device 10 is 600 V (volts), and the maximum voltage applied to the semiconductor layer 120, the semiconductor layer 130 and the semiconductor layer 140 is 600 V. The thickness of the protective film 180 is determined according to this specification, such that the protective film 180 has dielectric breakdown strength of 8 to 10 MV/cm (megavolts/centimeter). The thickness of the protective film 180 is preferably not less than 400 nm (nanometers). According to this embodiment, the thickness of the protective film 180 is set to 600 nm. The thickness of the protective film 180 may be, for example, 3 μm (micrometers) for the breakdown voltage of 3 kV (kilovolts), 50 μm for the breakdown voltage of 50 kV and 500 μm for the breakdown voltage of 500 kV. The protective film 180 has a first layer 181 and a second layer 182.

The first layer 181 of the protective film 180 is made of aluminum oxide ($Al_2O_3$) and is arranged adjacent to the respective interfaces of the semiconductor layer 120, the semiconductor layer 130 and the semiconductor layer 140 (e.g., interfaces 122, 132, 141 and 142) and cover the edge 162 of the p-n junction surface 160. In terms of improving the workability of the protective film 180, the thickness of the first layer 181 is preferably not greater than 500 nm, is more preferably not greater than 300 nm and is furthermore preferably not greater than 100 nm. According to this embodiment, the thickness of the first layer 181 is 100 nm. The thickness of the first layer 181 may be about 1 nm, which is the limit value for practically controlling deposition of the first layer 181.

The second layer 182 of the protective film 180 is a layer made of an electrical insulation material different from aluminum oxide ($Al_2O_3$) and formed on the first layer 181. According to this embodiment, the second layer 182 is made of silicon dioxide ($SiO_2$). According to this embodiment, the thickness of the second layer 182 is 500 nm.

The protective film 180 has opening structures 185 formed to pass through the first layer 181 and the second layer 182. The opening structures 185 are formed by removing at least the first layer 181 from the top of the interface 141 of the semiconductor layer 140 by wet etching in the process of removing the protective film 180 from the top of the interface 141 of the semiconductor layer 140 to expose the interface 141.

The source electrode 192 of the semiconductor device 10 is an electrode which has electrical conductivity and forms an ohmic junction with the interface 141 of the semiconductor layer 140. The source electrodes 192 are located inside of the respective opening structures 185 of the protective film 180. According to this embodiment, the source electrodes 192 are disposed on the +X-axis direction side and the −X-axis direction side of the interface 141 of the semiconductor layer 140 parted by the trench 105. According to this embodiment, the source electrode 192 is an electrode formed by laminating a layer made of aluminum (Al) on a layer made of titanium (Ti) and subsequently alloying the layered structure by firing.

The gate insulating film 195 of the semiconductor device 10 is an insulating film which has electrical insulation properties and is extended between the source electrode 192 on the +X-axis direction side and the source electrode 192 on the −X-axis direction side across the trench 105. According to this embodiment, silicon dioxide ($SiO_2$) is used for the material of the gate insulating film 195. According to another embodiment, another electrical insulation material may be used for the material of the gate insulating film 195.

The gate electrode 196 of the semiconductor device 10 is an electrode which has electrical conductivity and is formed over the gate insulating film 195. According to this embodiment, the gate electrode 196 is made of aluminum (Al).

The drain electrode 198 of the semiconductor device 10 is an electrode which has electrical conductivity and forms an ohmic junction with the −Z-axis direction side of the substrate 110. According to this embodiment, the drain electrode 198 is an electrode formed by laminating a layer made of aluminum (Al) on a layer made of titanium (Ti) and subsequently alloying the layered structure by firing.

A-2. Manufacturing Method of Semiconductor Device

Figure 2:
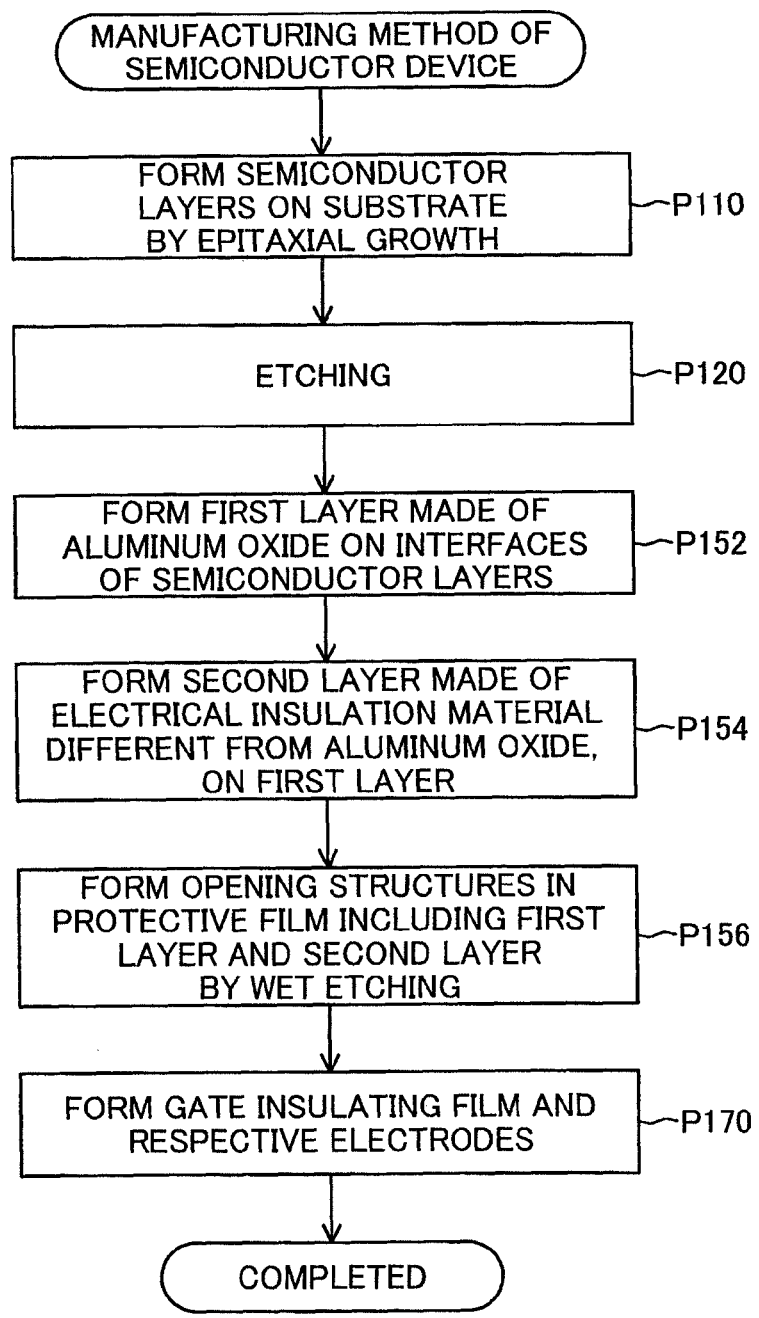
FIG. 2 is a flowchart showing a manufacturing method of the semiconductor device according to the first embodiment.

FIG. 2 is a flowchart showing a manufacturing method of the semiconductor device 10. According to the manufacturing method of the semiconductor device 10, the manufacturer forms the semiconductor layer 120 on the substrate 110 by epitaxial growth, subsequently forms the semiconductor layer 130 on the semiconductor layer 120 by epitaxial growth and then forms the semiconductor layer 140 on the semiconductor layer 130 by epitaxial growth (step P110). According to this embodiment, the manufacturer forms the semiconductor layer 120, the semiconductor layer 130 and the semiconductor layer 140 on the substrate 110 by epitaxial growth using an MOCVD apparatus for metalorganic chemical vapor deposition (MOCVD).

After forming the semiconductor layer 120, the semiconductor layer 130 and the semiconductor layer 140 (step P110), the manufacturer performs etching (step P120). According to this embodiment, the manufacturer forms the trench 105, the interface 122 of the semiconductor layer 120, the interface 132 of the semiconductor layer 130 and the interface 142 of the semiconductor layer 140 by etching (step P120). The interfaces 122, 132 and 142 provide isolation to electrically isolate the elements from one another. According to another embodiment, the manufacturer may form a recess as appropriate which is a concave used to form an electrode to be joined with the semiconductor layer 130 by etching (step P120).

After performing etching (step P120), the manufacturer forms the first layer 181 made of aluminum oxide ($Al_2O_3$) over the range from the interface on the +Z-axis direction side of the semiconductor layer 120 through the interface 122 of the semiconductor layer 120, the interface 132 of the semiconductor layer 130 and the interface 142 of the semiconductor layer 140 to the interface 141 of the semiconductor layer 140 (step P152). According to this embodiment, the manufacturer forms the first layer 181 by ALD method.

After forming the first layer 181 (step P152), the manufacturer forms the second layer 182 made of the electrical insulation material different from aluminum oxide ($Al_2O_3$) on the first layer 181 (step P154). This completes formation of the protective film 180 on the semiconductor layer 120, the semiconductor layer 130 and the semiconductor layer 140. According to this embodiment, the manufacturer forms the second layer 182 made of silicon dioxide ($SiO_2$). According to this embodiment, the manufacturer forms the second layer 182 by chemical vapor deposition (CVD) method.

After forming the second layer 182 (step P154), the manufacturer forms the opening structures 185 in the protective film 180 including the first layer 181 and the second layer 182 by wet etching (step P156). According to this embodiment, the manufacturer removes specific parts of the first layer 181 and the second layer 182 by wet etching to form the opening structures 185. According to this embodiment, an etching solution used for formation of the opening structures 185 is a hydrofluoric acid mixed solution prepared at a mixing rate of hydrofluoric acid (HF): buffered hydrofluoric acid (BHF): water=1:4:100. According to this embodiment, the processing rate of wet etching for the first layer 181 and the second layer 182 is 40 to 60 nm/minute.

Figure 7:
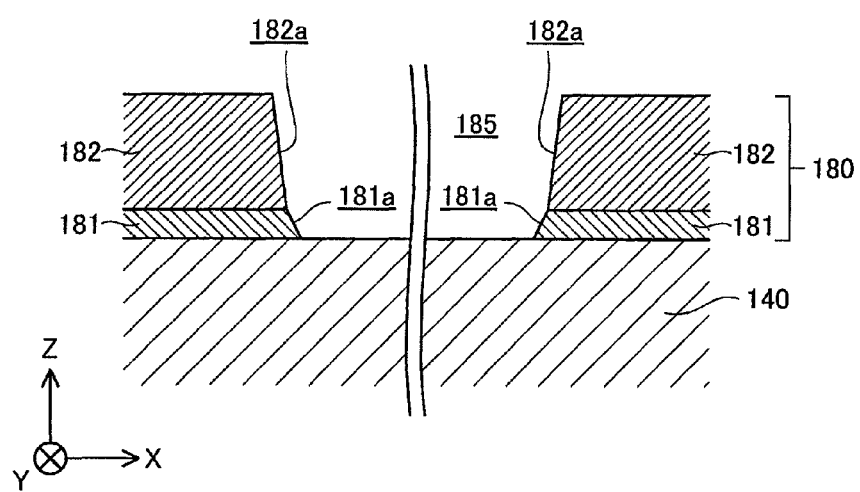
FIG. 7 is a diagram illustrating the configuration detail of an opening structure.

FIG. 7 is a diagram illustrating the configuration detail of the opening structure 185. According to this embodiment, the opening structure 185 is formed by processing the first layer 181 and the second layer 182 by isotropic wet etching. The first layer 181 has a surface 181a defining part of the opening structure 185. The second layer 182 has a surface 182a defining part of the opening structure 185. The surface 181a of the first layer 181 is formed by isotropic wet etching, so as to be sloped outward from the opening structure 185 from the −Z-axis direction side to the +Z-axis direction side (i.e., from the semiconductor layer 140-side to the second layer 182-side). The surface 182a of the second layer 182 is formed by isotropic wet etching, so as to be sloped outward from the opening structure 185 from the −Z-axis direction side to the +Z-axis direction side.

Figure 8:
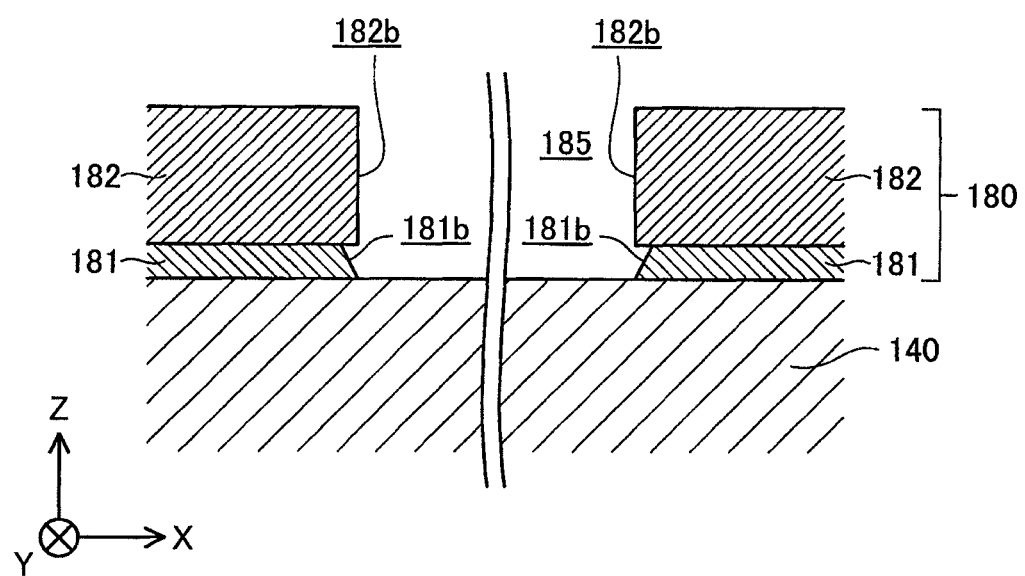
FIG. 8 is a diagram illustrating the configuration detail of the opening structure according to another embodiment.

FIG. 8 is a diagram illustrating the configuration detail of the opening structure 185 according to another embodiment. According to another embodiment, the opening structure 185 may be formed by processing the second layer 182 by anisotropic dry etching and subsequently processing the first layer 181 by isotropic wet etching. The first layer 181 has a surface 181b defining part of the opening structure 185. The second layer 182 has a surface 182b defining part of the opening structure 185. The surface 181b of the first layer 181 is formed by isotropic wet etching, so as to be sloped outward from the opening structure 185 from the −Z-axis direction side to the +Z-axis direction side (i.e., from the semiconductor layer 140-side to the second layer 182-side). The surface 182b of the second layer 182 is formed by anisotropic dry etching, so as to be almost parallel to the Z axis which is the thickness direction of the second layer 182.

Referring back to FIG. 2, after forming the opening structures 185 in the protective film 180 (step P156), the manufacturer forms the source electrodes 192, the gate insulating film 195, the gate electrode 196 and the drain electrode 198 (step P170). According to this embodiment, the manufacturer forms a layer made of titanium (Ti) on the interface 141 of the semiconductor layer 140 by vapor deposition, additionally forms a layer made of aluminum (Al) on the titanium layer by vapor deposition and alloys these layers by firing, so as to form the source electrodes 192. According to this embodiment, the manufacturer forms the gate insulating film 195 made of silicon dioxide ($SiO_2$) in the area between the source electrode 192 on the +X-axis direction side and the source electrode 192 on the −X-axis direction side across the trench 105 by ALD (atomic layer deposition) method. According to this embodiment, the manufacturer forms the gate electrode 196 made of aluminum (Al) on the gate insulating film 195 by vapor deposition. According to this embodiment, the manufacturer forms a layer made of titanium (Ti) on the −Z-axis direction side of the substrate 110 by vapor deposition, additionally forms a layer made of aluminum (Al) on the titanium layer by vapor deposition and alloys these layers by firing, so as to form the drain electrode 198.

The semiconductor device 10 is completed by the above series of steps. According to another embodiment, the manufacturer may perform at least part of the step of forming the respective electrodes (step P170) prior to the steps of forming the protective film 180 (steps P152, P154 and P156).

A-3. Evaluation of Semiconductor Device

Figure 3:
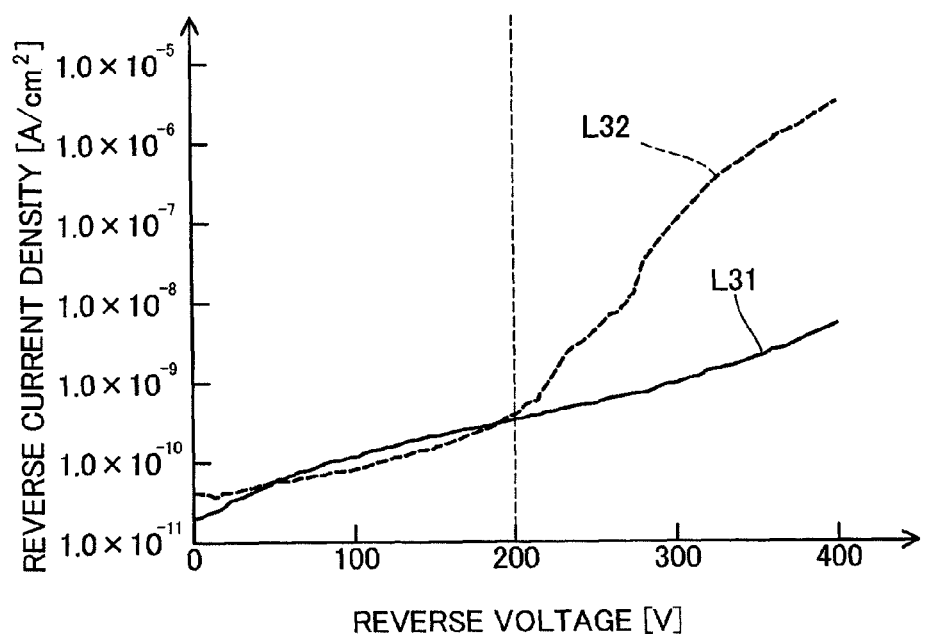
FIG. 3 is a graph showing the results of evaluation of a protective film.

FIG. 3 is a graph showing the results of evaluation of the protective film 180. In the evaluation test of FIG. 3, the examiner has provided a first specimen and a second specimen as semiconductor devices and measured the reverse current density under application of a reverse voltage on each specimen. The first specimen is the semiconductor device 10 described above. The second specimen has a similar configuration to that of the semiconductor device 10 except that the protective film 180 is replaced by an insulating film made of silicon dioxide ($SiO_2$). The insulating film of the second specimen has a single-layer structure and has the thickness of 600 nm.

The graph of FIG. 3 is a single logarithmic chart showing the reverse current density of each specimen against the reverse voltage. The graph of FIG. 3 has the reverse voltage as abscissa and the reverse current density on the logarithmic scale as ordinate. In the graph of FIG. 3, a solid-line plot L31 shows the measured values of the first specimen, and a broken-line plot L32 shows the measured values of the second specimen.

According to the evaluation results of FIG. 3, the first specimen more effectively reduces the reverse current density than the second specimen at the reverse voltages of and above 200 V. In other words, the first specimen more effectively reduces the leak current than the second specimen.

A-4. Advantageous Effects

In the first embodiment described above, the first layer 181 made of $Al_2O_3$ serves to reduce the leak current on the interfaces 122, 132, 141 and 142 of the semiconductor layers 120, 130 and 140 and the edge 162 of the p-n junction surface 160, whereas the second layer 182 made of $SiO_2$ serves to reinforce the dielectric breakdown strength and thereby reduce the thickness required for the first layer 181. This accordingly achieves both improvement of the electrical properties and improvement of the workability of the protective film 180.

Application of $SiO_2$ for the electrical insulation material of the second layer 182 effectively improves the dielectric breakdown strength of the insulating film. Application of $SiO_2$ for the electrical insulation material of the second layer 182 also allows for selection between wet etching and dry etching as the technique of etching the second layer 182 and thereby enhances the flexibility of the processing technique of the protective film 180. Selection of dry etching further improves the workability of the protective film 180.

The thickness of the first layer 181 is not greater than 500 nm. This effectively suppresses etching failure of the first layer 181 by wet etching.

The opening structures 185 are formed by removing parts of the first layer 181 from the interface 141 of the semiconductor layer 140 by wet etching. This suppresses the potential damage of the semiconductor layer 140, compared with the method of removing part of the first layer 181 by dry etching.

A-5. First Modification

Figure 4:
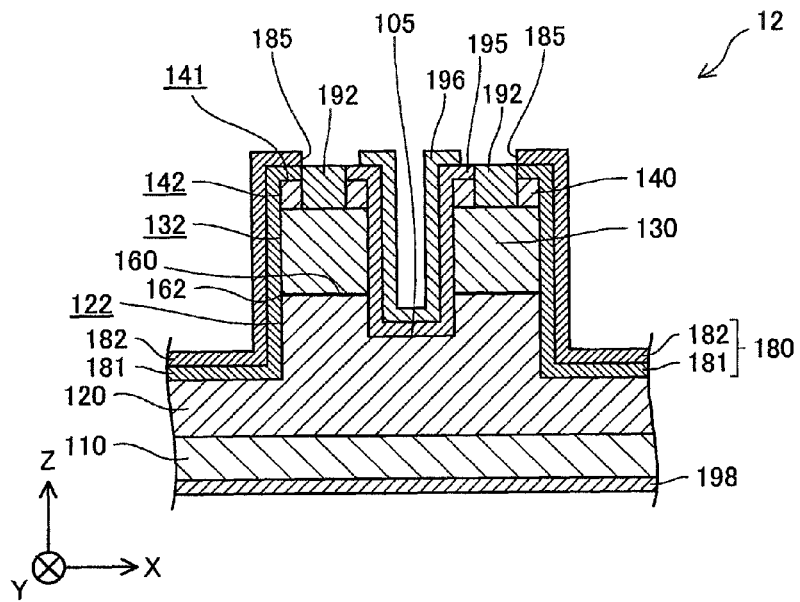
FIG. 4 is a cross sectional view schematically illustrating the configuration of a semiconductor device according to a first modification of the first embodiment.

FIG. 4 is a cross sectional view schematically illustrating the configuration of a semiconductor device 12 according to a first modification of the first embodiment. The X, Y and Z axes are also shown in FIG. 4, like FIG. 1. The configuration of the semiconductor device 12 according to the first modification of the first embodiment is similar to the configuration of the semiconductor device 10 of the embodiment described above, except that source electrodes 192 are formed to pass through the semiconductor layer 140 and reach the semiconductor layer 130. The first modification of the first embodiment achieves both improvement of the electrical properties and improvement of the workability of the protective film 180, like the embodiment described above.

A-6. Second Modification

Figure 5:
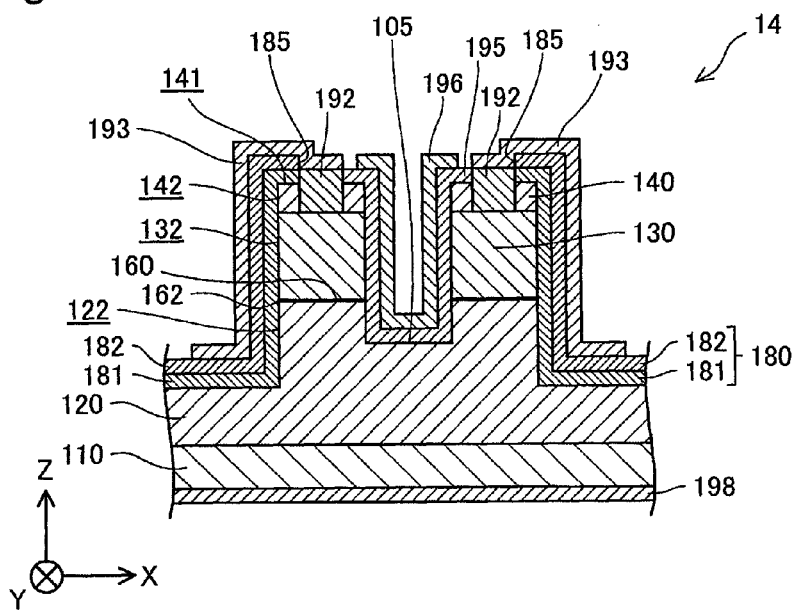
FIG. 5 is a cross sectional view schematically illustrating the configuration of a semiconductor device according to a second modification of the first embodiment.

FIG. 5 is a cross sectional view schematically illustrating the configuration of a semiconductor device 14 according to a second modification of the first embodiment. The X, Y and Z axes are also shown in FIG. 5, like FIG. 1. The configuration of the semiconductor device 14 according to the second modification of the first embodiment is similar to the configuration of the semiconductor device 12 of the first modification described above, except addition of a field plate electrode 193. The field plate electrode 193 of the semiconductor device 14 is an electrode extended from the top of the source electrodes 192 located inside of the opening structures 185 along the protective film 180. Such arrangement of the field plate electrode 193 forms a field plate structure between the field plate electrode 193 and the respective semiconductor layers 120, 130 and 140 across the protective film 180. The second modification of the first embodiment achieves both improvement of the electrical properties and improvement of the workability of the protective film 180, like the embodiment described above.

B. Second Embodiment

Figure 6:
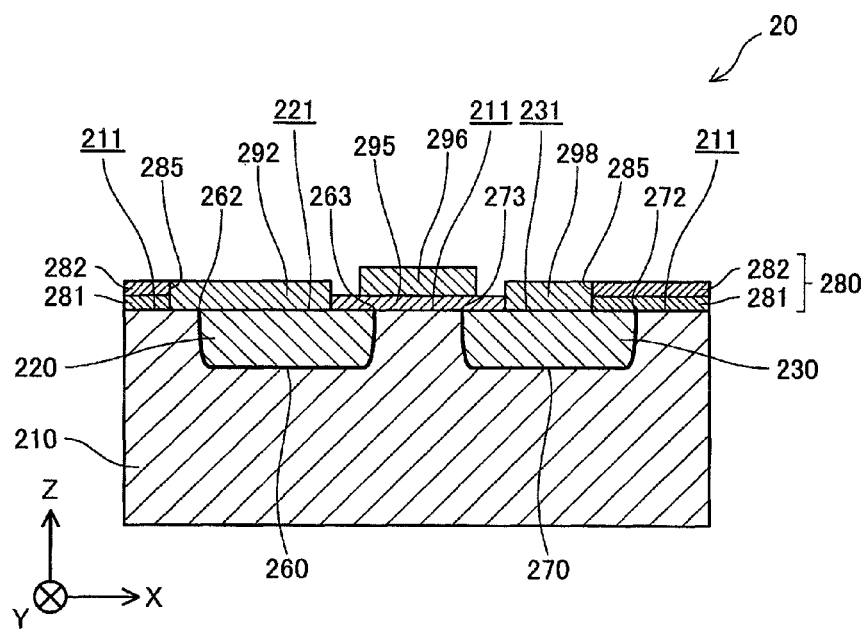
FIG. 6 is a cross sectional view schematically illustrating the configuration of a semiconductor device according to a second embodiment.

FIG. 6 is a cross sectional view schematically illustrating the configuration of a semiconductor device 20 according to a second embodiment. The X, Y and Z axes are also shown in FIG. 6, like FIG. 1.

The semiconductor device 20 is a GaN-based semiconductor device. According to this embodiment, the semiconductor device 20 is a planar MOSFET. The semiconductor device 20 includes a semiconductor layer 210, a semiconductor layer 220, a semiconductor layer 230, a protective film 280, a source electrode 292, a gate insulating film 295, a gate electrode 296 and a drain electrode 298.

The semiconductor layer 210 of the semiconductor device 20 is a p-type semiconductor layer formed in a plate-like shape extended along the X axis and the Y axis. According to this embodiment, the semiconductor layer 210 is mainly made of gallium nitride (GaN) and contains magnesium (Mg) as the acceptor. The semiconductor layer 210 has an interface 211 which is extended along the X axis and the Y axis and faces the +Z-axis direction.

The semiconductor layer 220 of the semiconductor device 20 is an n-type semiconductor layer arranged to fill a recess formed on the +Z-axis direction side of the semiconductor layer 210. According to this embodiment, the semiconductor layer 220 is mainly made of gallium nitride (GaN) and contains silicon (Si) as the donor. The semiconductor layer 220 has an interface 221 which is extended along the X axis and the Y axis and faces the +Z-axis direction.

The semiconductor layer 230 of the semiconductor device 20 is an n-type semiconductor layer arranged to fill a recess formed on the +Z-axis direction side of the semiconductor layer 210 at a position away from the semiconductor layer 220. According to this embodiment, the semiconductor layer 230 is mainly made of gallium nitride (GaN) and contains silicon (Si) as the donor. The carrier concentration of the semiconductor layer 230 is higher than the carrier concentration of the semiconductor layer 220. The semiconductor layer 230 has an interface 231 which is extended along the X axis and the Y axis and faces the +Z-axis direction.

A p-n junction surface 260 is formed between the semiconductor layer 210 and the semiconductor layer 220. The p-n junction surface 260 is an interface where the semiconductor layer 210 is joined with the semiconductor layer 220. An edge 262 on the −X-axis direction side of the p-n junction surface 260 and an edge 263 on the +X-axis direction side of the p-n junction surface 260 form a boundary between the interface 211 of the semiconductor layer 210 and the interface 221 of the semiconductor layer 220.

A p-n junction surface 270 is formed between the semiconductor layer 210 and the semiconductor layer 230. The p-n junction surface 270 is an interface where the semiconductor layer 210 is joined with the semiconductor layer 230. An edge 272 on the −X-axis direction side of the p-n junction surface 270 and an edge 273 on the +X-axis direction side of the p-n junction surface 270 form a boundary between the interface 211 of the semiconductor layer 210 and the interface 231 of the semiconductor layer 230.

The protective film 280 of the semiconductor device 20 has electrical insulation properties and is arranged to coat the respective interfaces of the semiconductor layer 210 and the semiconductor layer 230. The method of forming the protective film 280 is the same as the method of forming the protective film 180 described in the first embodiment.

According to this embodiment, the protective film 280 is formed to cover the interface 211 of the semiconductor layer 210 up to the edge 262 of the p-n junction surface 260 on the −X-axis direction side. According to this embodiment, the protective film 280 is formed to cover the range from the interface 211 of the semiconductor layer 210 through the edge 272 of the p-n junction surface 270 to the interface 231 of the semiconductor layer 230 on the +X-axis direction side.

The thickness of the protective film 280 is preferably not less than 400 nm. According to this embodiment, the thickness of the protective film 280 is set to 600 nm, like the protective film 180 of the first embodiment. The thickness of the protective film 280 may be, for example, 3 μm for the breakdown voltage of 3 kV, 50 μm for the breakdown voltage of 50 kV and 500 μm for the breakdown voltage of 500 kV. The protective film 280 has a first layer 281 and a second layer 282.

The first layer 281 of the protective film 280 is made of aluminum oxide ($Al_2O_3$) and is arranged adjacent to the interface 211 of the semiconductor layer 210, the interface 221 of the semiconductor layer 220 and the interface 231 of the semiconductor layer 230. The first layer 281 accordingly covers the edge 262 of the p-n junction surface 260 and the edge 272 of the p-n junction surface 270. In terms of improving the workability of the protective film 280, the thickness of the first layer 281 is preferably not greater than 500 nm, is more preferably not greater than 300 nm and is furthermore preferably not greater than 100 nm. According to this embodiment, the thickness of the first layer 281 is 100 nm. The thickness of the first layer 281 may be about 1 nm, which is the limit value for practically controlling deposition of the first layer 281.

The second layer 282 of the protective film 280 is a layer made of an electrical insulation material different from aluminum oxide ($Al_2O_3$) and formed on the first layer 281. According to this embodiment, the second layer 282 is made of silicon dioxide ($SiO_2$). According to this embodiment, the thickness of the second layer 282 is 500 nm.

The protective film 280 has an opening structure 285 formed to pass through the first layer 281 and the second layer 282. The opening structure 285 is formed by removing at least the first layer 281 from the respective interfaces by wet etching in the process of removing the protective film 180 from the interface 211 of the semiconductor layer 210, the interface 221 of the semiconductor layer 220 and the interface 231 of the semiconductor layer 230 to expose the respective interfaces. The method of forming the opening structure 285 is the same as the method of forming the opening structures 185 in the protective film 180 described in the first embodiment.

The source electrode 292 of the semiconductor device 20 is an electrode which has electrical conductivity and forms an ohmic junction with the range from the interface 221 of the semiconductor layer 220 through the edge 262 of the p-n junction surface 260 to the interface 211 of the semiconductor layer 210. The source electrode 292 is located inside of the opening structure 285 of the protective film 280. According to this embodiment, the source electrode 292 is an electrode formed by laminating a layer made of aluminum (Al) on a layer made of titanium (Ti) and subsequently alloying the layered structure by firing.

The gate insulating film 295 of the semiconductor device 20 is an insulating film which has electrical insulation properties and is formed between the source electrode 292 and the drain electrode 298 to be extended over the range from the interface 221 of the semiconductor layer 220 through the interface 211 of the semiconductor layer 210 to the interface 231 of the semiconductor layer 230. According to this embodiment, silicon dioxide ($SiO_2$) is used for the material of the gate insulating film 295. According to another embodiment, another electrical insulation material may be used for the material of the gate insulating film 295.

The gate electrode 296 of the semiconductor device 20 is an electrode which has electrical conductivity and is formed over the gate insulating film 295. According to this embodiment, the gate electrode 296 is made of aluminum (Al).

The drain electrode 298 of the semiconductor device 20 is an electrode which has electrical conductivity and forms an ohmic junction with the interface 231 of the semiconductor layer 230. The drain electrode 298 is located inside of the opening structure 285 of the protective film 280. According to this embodiment, the drain electrode 298 is an electrode formed by laminating a layer made of aluminum (Al) on a layer made of titanium (Ti) and subsequently alloying the layered structure by firing.

The second embodiment described above achieves both improvement of the electrical properties and improvement of the workability of the protective film 280, like the first embodiment.

C. Other Embodiments

The invention is not limited to the above embodiments, examples or modifications, but a diversity of variations and modifications may be made to the embodiments without departing from the scope of the invention. For example, the technical features of the embodiments, examples or modifications corresponding to the technical features of the respective aspects described in SUMMARY OF INVENTION may be replaced or combined appropriately, in order to solve part or all of the problems described above or in order to achieve part or all of the advantageous effects described above. Any of the technical features may be omitted appropriately unless the technical feature is described as essential herein.

The insulating film of the above embodiment may be applied to an insulating film of a semiconductor device having a different configuration from that of the above embodiment.

According to the embodiments described above, the first layer of the protective film may be comprised of a plurality of layers that is equal to or greater than two. In the application of the first layer comprised of the plurality of layers, the total thickness of these layers is preferably not greater than 500 nm, is more preferably not greater than 300 nm and is furthermore preferably not greater than 100 nm.

According to the embodiments described above, the electrical insulation material of the second layer of the protective film may be at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON). Application of at least one of $SiO_2$, SiN and SiON for the electrical insulation material of the second layer allows for selection between wet etching and dry etching as the technique of etching the second layer and thereby enhances the flexibility of the processing technique of the insulating film. Selection of dry etching further improves the workability of the protective film. Application of at least one of $HfO_2$, AlN, $ZrO_2$ and ZrON for the electrical insulation material of the second layer effectively improves the function of the insulating film that relieves the potential crowding.

According to the embodiments described above, the second layer of the protective film may be comprised of a plurality of layers that is equal to or greater than two. In the application of the second layer comprised of the plurality of layers, the materials of these layers may be an identical material or may be different materials.

According to the embodiments described above, the technique for forming the respective layers of the protective film is not limited to the ALD method but may be sputtering method.

According to the embodiments described above, the material of the substrate is not limited to gallium nitride (GaN) but may be, for example, silicon (Si), sapphire ($Al_2O_3$) or silicon carbide (SiC). A material likely to conduct electricity is employed for the substrate of vertical semiconductor devices, whereas a material unlikely to conduct electricity is employed for the substrate of horizontal semiconductor devices.

According to the embodiments described above, the donor contained in the n-type semiconductor layer is not limited to silicon (Si) but may be, for example, germanium (Ge) or oxygen (O).

According to the embodiments described above, the acceptor contained in the p-type semiconductor layer is not limited to magnesium (Mg) but may be, for example, zinc (Zn) or carbon (C).

According to the embodiments described above, the material of the electrode forming an ohmic junction with the n-type semiconductor layer is not limited to the alloy of titanium (Ti) and aluminum (Al) but may be another metal.

According to the embodiments described above, the material of the field plate electrode is not limited to aluminum (Al) but may be another metal.

What is claimed is:

1. A semiconductor device comprising:
a p-type semiconductor layer mainly made of gallium nitride (GaN);
an n-type semiconductor layer mainly made of gallium nitride (GaN) and joined with the p-type semiconductor layer;
a protective film provided to have electrical insulation property, and arranged to coat the p-type semiconductor layer and the n-type semiconductor layer, the protective film including,
a first layer made of aluminum oxide ($Al_2O_3$) and arranged adjacent to the p-type semiconductor layer and the n-type semiconductor layer to coat an edge of a p-n junction surface where the p-type semiconductor layer is joined with the n-type semiconductor layer,
a second layer made of an electrical insulation material different from aluminum oxide ($Al_2O_3$) and formed on the first layer, and
an opening structure formed to pass through the first layer and the second layer;
a gate insulating film provided to have electrical insulation property and placed inside of the opening structure of the protective film to coat the p-type semiconductor layer and the n-type semiconductor layer, the gate insulating film is formed of a composition different from the protective film; and
a gate electrode joined with the gate insulating film.

2. The semiconductor device according to claim 1, wherein the electrical insulation material of the second layer is at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON).

3. The semiconductor device according to claim 1, wherein a thickness of the first layer is equal to or less than 500 nm.

4. The semiconductor device according to claim 1, wherein a total thickness of the protective film including the first layer and the second layer is equal to or greater than 400 nm.

5. The semiconductor device according to claim 1, wherein a surface of the first layer that defines part of the opening structure is sloped outward from the opening structure from a semiconductor layer side to a second layer side.

6. The semiconductor device according to claim 1, wherein a material of the gate insulating film is silicon dioxide ($SiO_2$).

7. The semiconductor device according to claim 6, wherein the electrical insulation material of the second layer is at least one of silicon dioxide ($SiO_2$), silicon nitride (SiN), silicon oxynitride (SiON), hafnium oxide ($HfO_2$), aluminum nitride (AlN), zirconium oxide ($ZrO_2$) and zirconium oxynitride (ZrON).

* * * * *